United States Patent
Yahng et al.

(10) Patent No.: US 7,763,550 B2
(45) Date of Patent: Jul. 27, 2010

(54) METHOD OF FORMING A LAYER ON A WAFER

(75) Inventors: Ji-Sang Yahng, Seoul (KR); Young-Wook Park, Gyeonggi-do (KR); Jae-Jong Han, Seoul (KR); Jum-Soo Chang, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1325 days.

(21) Appl. No.: 11/061,407

(22) Filed: Feb. 18, 2005

(65) Prior Publication Data

US 2005/0233559 A1    Oct. 20, 2005

(30) Foreign Application Priority Data

Feb. 19, 2004    (KR) .................. 10-2004-0010879

(51) Int. Cl.
*H01L 21/31* (2006.01)
*H01L 21/677* (2006.01)
*C23C 16/00* (2006.01)

(52) U.S. Cl. .................. 438/765; 118/719; 204/298.25; 414/936; 414/939

(58) Field of Classification Search ................ 438/765; 118/719, 725; 204/298.25; 414/936, 939
See application file for complete search history.

(56) References Cited

U.S. PATENT DOCUMENTS

| 5,407,181 | A  |   | 4/1995  | Ohsawa ..................... 266/257 |
| 5,462,397 | A  | * | 10/1995 | Iwabuchi .................... 414/217 |
| 5,520,742 | A  | * | 5/1996  | Ohkase ....................... 118/724 |
| 5,595,604 | A  |   | 1/1997  | Kobayashi et al. .......... 118/715 |
| 5,645,419 | A  | * | 7/1997  | Ohsawa et al. .............. 432/241 |
| 5,829,969 | A  |   | 11/1998 | Miyashita et al. ........... 432/253 |
| 6,143,083 | A  | * | 11/2000 | Yonemitsu et al. .......... 118/719 |
| 6,235,121 | B1 |   | 5/2001  | Honma et al. ............... 118/730 |
| 6,358,867 | B1 |   | 3/2002  | Tews et al. .................. 438/771 |
| 2005/0196533 | A1 | * | 9/2005  | Hasebe et al. ............ 427/248.1 |
| 2007/0137794 | A1 | * | 6/2007  | Qiu et al. ............... 156/345.33 |

FOREIGN PATENT DOCUMENTS

| KR | 940024918 | 11/1994 |
| KR | 990039877 A | 11/1999 |
| KR | 1020000019926 | 4/2000 |

\* cited by examiner

*Primary Examiner*—Zandra Smith
*Assistant Examiner*—Pamela E Perkins
(74) *Attorney, Agent, or Firm*—Myers Bigel Sibley & Sajovec

(57) ABSTRACT

A layer is formed on a semiconductor wafer in an apparatus having a processing chamber, a transferring chamber, and a wafer boat. The boat having the semiconductor wafer thereon is rotated in the transferring chamber. While the boat is rotated, the boat is transferred between the transferring chamber and the processing chamber and a reaction gas is provided to the processing chamber to form the layer on the wafer.

19 Claims, 3 Drawing Sheets

| R10 | : 7.9~8.2 Å |
| R9  | : 7.7~7.9 Å |
| R8  | : 7.4~7.7 Å |
| R7  | : 7.1~7.4 Å |
| R6  | : 6.9~7.1 Å |
| R5  | : 6.6~6.9 Å |
| R4  | : 6.3~6.6 Å |
| R3  | : 6.0~6.3 Å |
| R2  | : 5.8~6.0 Å |
| R1  | : 5.5~5.8 Å |

METHOD OF FORMING A LAYER ON A WAFER

CROSS REFERENCE TO RELATED APPLICATION

This application claims priority under 35 USC §119 to Korean Patent Application No. 2004-10879 filed on Feb. 19, 2004, the disclosure of which is herein incorporated by reference in its entirety.

FIELD OF THE INVENTION

The present invention relates to methods of forming a layer on a wafer. More particularly, the present invention relates to methods of forming oxide layers on wafers.

BACKGROUND

A semiconductor device is generally manufactured by performing several manufacturing processes on a silicon wafer. For example, a deposition process may be carried out to form a layer of material on the wafer, and/or an oxidation process may be performed to form an oxide layer on the surface of the wafer or to change a deposited layer formed on the wafer into an oxide layer. In addition, a photolithography process may be carried out to form a pattern having a predetermined shape on the wafer, and a planarization process may be performed to planarize a layer formed on the wafer.

Oxide layers are generally formed on a wafer by a thermal oxidation process. The thermal oxidation process is performed using a heat treatment apparatus, such as a vertical diffusion furnace, and by employing an oxygen ($O_2$) gas. For example, a heat treatment apparatus is disclosed in U.S. Pat. No. 6,235,121 to Honma et al., the disclosure of which is hereby incorporated by reference in its entirety.

A conventional heat treatment apparatus may include a vertical processing chamber, a transferring chamber, a wafer boat, a rotating driving unit, and a vertical driving unit. The processing chamber may include a reaction tube, a heating furnace enclosing the reaction tube, and a cylindrical manifold coupled to a lower portion of the reaction tube.

A radical oxidation method using oxygen radicals or oxygen atoms has also been used to form an oxide layer having improved electrical properties on a wafer. For example, the radical oxidation method is disclosed in U.S. Pat. No. 6,358,867 issued to Tews et al.

A radical oxidation method using the conventional heat treatment apparatus described above is generally performed as follows. A plurality of wafers is loaded into the wafer boat of the heat treatment apparatus. The wafer boat is transferred from the transferring chamber into the reaction tube of the heat treatment apparatus by the vertical driving unit. A reaction gas, such as a gas including an oxygen ($O_2$) gas and a nitrogen ($N_2$) gas, is introduced into the reaction tube. Surfaces of the wafers are oxidized by the reaction gas so that oxide layers are formed on the wafers. The wafers are rotated in the reaction tube by the rotating driving unit to increase the uniformity of the thickness of the oxide layers.

Although the oxide layers formed by a radical oxidation method may have electrical properties sufficient for being employed as gate insulation layers of transistors, the thickness of the edge portions of the oxide layers may be thicker than those of the central portions of the oxide layers. This thickness difference may cause several disadvantages in successive processes for manufacturing the semiconductor device.

SUMMARY OF THE INVENTION

According to embodiments of the present invention, methods of forming a layer on a semiconductor wafer in an apparatus having a processing chamber, a transferring chamber, and a wafer boat are provided. The boat having the semiconductor wafer thereon is rotated in the transferring chamber. While the boat is rotated, the boat is transferred between the transferring chamber and the processing chamber and a reaction gas is provided to the processing chamber to form the layer on the wafer.

According to further embodiments of the present invention, methods of forming oxide layers include loading a plurality of wafers onto a boat positioned in a transferring chamber. The boat is moved upwardly to transfer the boat into a vertical reaction tube disposed over the transferring chamber while the boat is being rotated at a predetermined rotational speed. Oxygen radicals are provided onto surfaces of the wafers loaded on the boat disposed in the reaction tube to form an oxide layer on the wafers. The boat is moved downwardly to transfer the boat from the reaction tube into the transferring chamber while the boat is being rotated at the predetermined rotational speed. The wafers are unloaded from the boat.

According to still further embodiments of the present invention, methods of forming a layer on a semiconductor wafer include, while rotating the wafer, transferring the wafer to the processing chamber and providing a reaction gas to the processing chamber to form the layer on the wafer.

DETAILED DESCRIPTION OF EMBODIMENTS OF THE INVENTION

Figure 1:
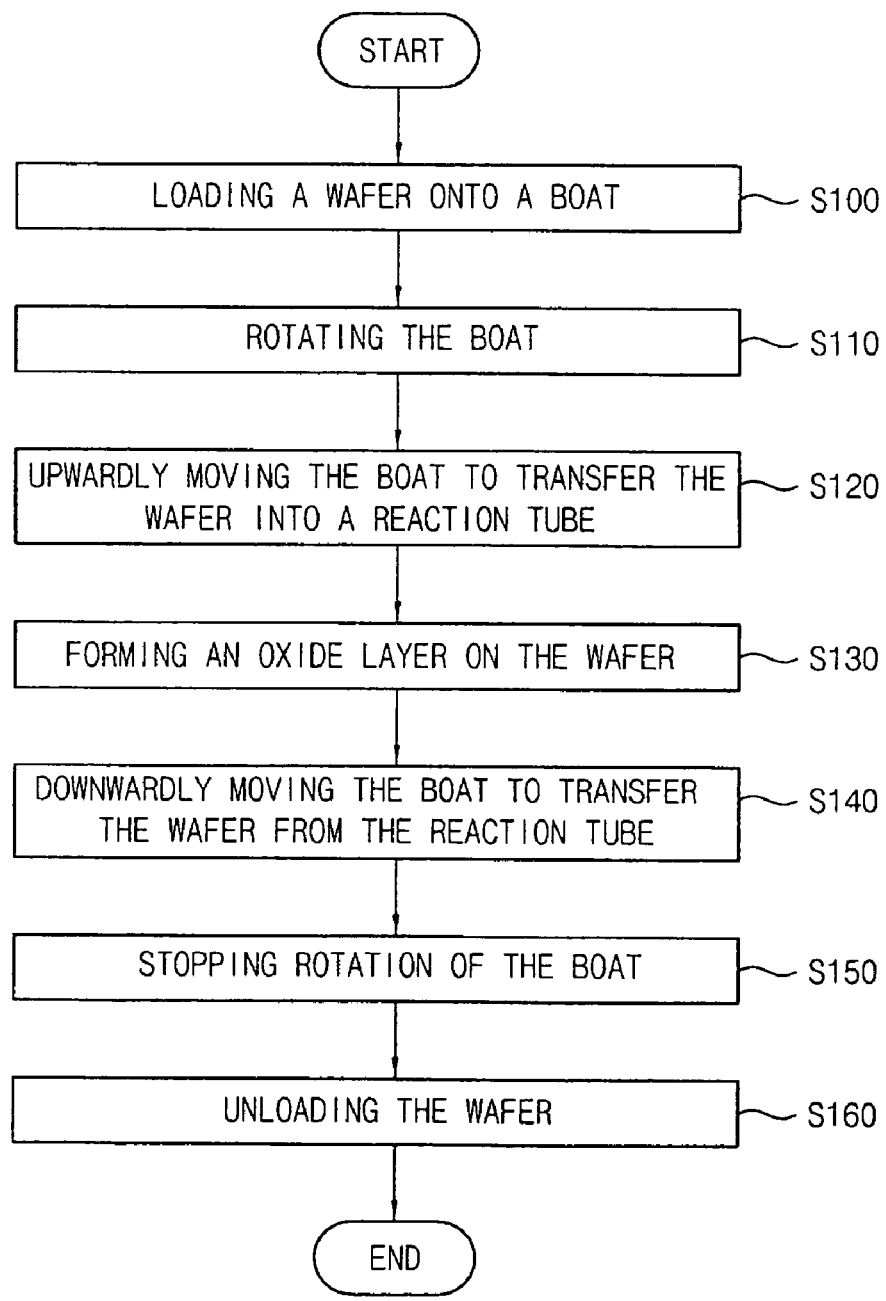
FIG. 1 is a flow chart illustrating methods of forming a layer on a wafer in accordance with embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like reference numerals refer to like elements throughout. It will be understood that when an element such as a layer, region or wafer is referred to as being "on" or "onto" another element, it can be directly on the other element or intervening elements may also be present.

Figure 2:
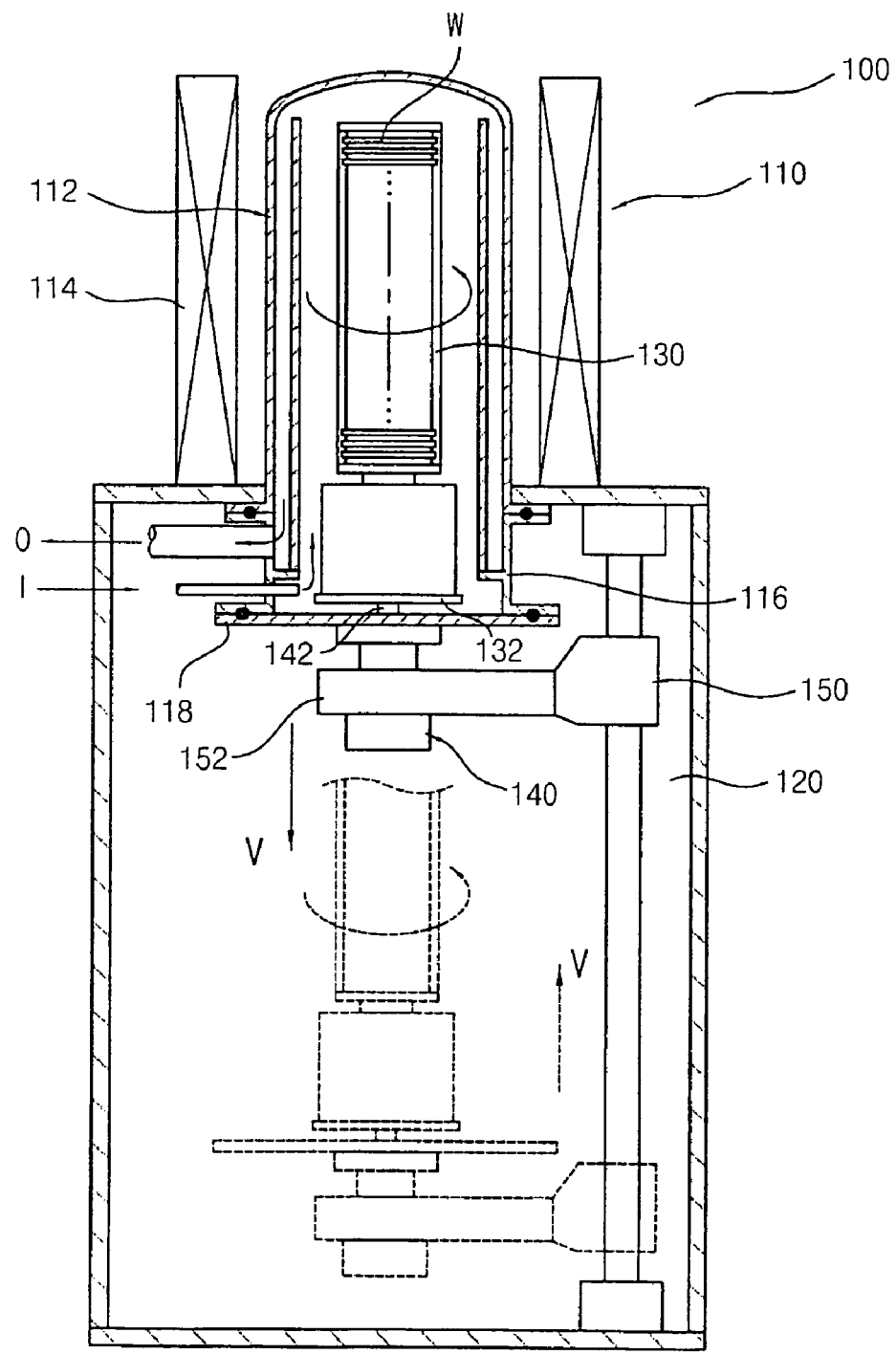
FIG. 2 is a cross-sectional view illustrating an apparatus for forming a layer in accordance with embodiments of the present invention.

Referring to FIG. 2, an apparatus 100 (such as a vertical heat treatment apparatus) for forming a layer on a wafer includes a vertical processing chamber 110, a transferring chamber 120 (e.g., a load lock chamber), a wafer boat 130, a rotating driving unit 140, and a vertical driving unit 150.

The processing chamber 110 includes a reaction tube 112, a heating furnace 114 and a cylindrical manifold 116. The reaction tube 112 has a double wall structure that includes an inner tube and an outer tube. As illustrated in FIG. 2, the heating furnace 114 encloses the reaction tube 112. The cylindrical manifold 116 is connected to a lower portion of the reaction tube 112. The cylindrical manifold 116 has a lower portion that includes an opening for receiving the wafer boat 130.

As illustrated in FIG. 2, the wafer boat 130 is inserted into the reaction tube 112 through the opening of the lower portion of the manifold 116. The opening of the lower portion of the manifold 116 is covered with a lid member 118.

Sealing members (not shown) are positioned between the reaction tube 112 and the manifold 116, and between the lid member 118 and the manifold 116, respectively.

The wafer boat 130 is positioned on a turntable 132, and the turntable 132 is coupled to the rotating driving unit 140 by a rotational axle 142. The rotating driving unit 140 is connected to a lower portion of a horizontal arm of the vertical driving unit 150. The lid member 118 is positioned on the horizontal arm 152 of the vertical driving unit 150. The rotational axle 142 is coupled to the rotating driving unit 140 through the lid member 118 and the horizontal arm 152.

Various elements described above with respect to the apparatus 100 are described, for example, in U.S. Pat. No. 5,407,181 to Ohsawa, U.S. Pat. No. 5,595,604 to Kobayashi et al., U.S. Pat. No. 5,829,969 to Miyashita et al., and U.S. Pat. No. 6,358,867 to Tews et al., the disclosures of which are hereby incorporated by reference in their entireties. It should be understood that the present invention is not limited to the above-described construction, and thus many apparent variations of the apparatus may be possible.

In FIG. 2, arrows indicate a vertical moving direction V of the wafer boat 130, a rotating direction of the wafer boat 130, an inlet direction I of a reaction gas to the reaction tube 112, and an outlet direction O of the reaction gas from the reaction tube 112, respectively.

Referring to FIGS. 1 and 2, wafers W are loaded into the wafer boat 130 in step S100. The wafers W may be vertically loaded on the wafer boat 130 by a transferring robot. For example, one to about fifty or more wafers W may be loaded on the wafer boat 130.

The wafer boat 130 having the wafers W thereon is rotated at a predetermined rotational speed so that native oxide layers may be uniformly formed on the wafers W on the wafer boat 130 (Block S110). That is, the native oxide layers formed on the wafers W may have increased uniformity of thickness because the wafer boat 130 is rotated at the predetermined speed.

As shown in FIG. 2, the rotating driving unit 140 rotates the wafer boat 130 at the predetermined rotational speed. For example, the wafer boat 130 may be rotated at a rotational speed in a range from about 0.5 to about 5 rpm. In some embodiments, the rotational speed of the wafer boat 130 is in a range from about 1 to about 2 rpm.

When the rotational speed of the wafer boat 130 is high, the wafers W loaded on the wafer boat 130 may be separated from the wafer boat 130. Thus, the rotational speed of the wafer boat 130 may be precisely adjusted to reduce the risk of separation of the wafers W from the wafer boat 130. Additionally, central axes the wafers W loaded in the wafer boat 130 may correspond to a central rotational axis of the wafer boat 130.

The wafer boat 130 moves upwardly to transfer the wafers W into the reaction tube 112 of FIG. 1 (Block S120). In particular, the vertical driving unit 150 moves the wafer boat 130 upwardly to transfer the waver W from the transferring chamber 120 to the reaction tube 112. The rotating driving unit 140 rotates the wafer boat 130 at the predetermined rotational speed while the wafer boat 130 moves upwardly.

A nitrogen gas may be provided into the transferring chamber 120 to prevent formation of the native oxide layers on the wafers W during the steps of Blocks S110 and S120. That is, the nitrogen gas provided onto the surfaces of the wafers W may prevent the formation of the native oxide layers on the wafers W.

Oxide layers are formed on the wafers W disposed in the reaction tube 112 (Block S130) The oxide layers are formed on the wafers W using a reaction gas introduced into the reaction tube 112. The reaction gas may include an oxygen ($O_2$) gas and a hydrogen ($H_2$) gas. The oxygen gas reacts with the hydrogen gas to thereby form oxygen radicals or activated oxygen atoms. The surfaces of the wafers W are oxidized by the oxygen radicals so that oxide layers are formed on the wafers W.

While the oxide layers are formed on the wafers W, the reaction chamber 112 may have a temperature of about 600 to about 1,200° C., and a pressure of about 25 to about 100 Pa. Additionally, while the oxide layers are formed on the wafers W, the rotating driving unit 140 rotates the wafer boat 130 at the predetermined rotational speed.

The wafer boat 130 moves downwardly to remove the wafers W from the reaction tube 112 (Block S140). That is, the vertical driving unit 150 moves the wafer boat 130 downwardly to transfer the wafers W from the reaction tube 112 to the transfer chamber 120. While the wafer boat 130 moves downwardly, the rotating driving unit 140 rotates the wafer boat 130 at the predetermined rotational speed.

The operation of the rotating unit 140 is stopped to cease the rotational of the wafer boat 130 (Block S150).

The wafers W disposed on the wafer boat 130 are unloaded from the wafer boat 130 by the transferring robot (Block S160).

A nitrogen gas may be provided into the transferring chamber 120 in the steps of Blocks S140 to S160.

As described above, the wafer boat 130 is rotated at the predetermined rotational speed during the steps of Blocks S110 to S150. Thus, uniformities of the oxide layers formed on the wafers W may be improved. Additionally, the steps of Blocks S110 to S120 may be performed simultaneously.

Figure 3:
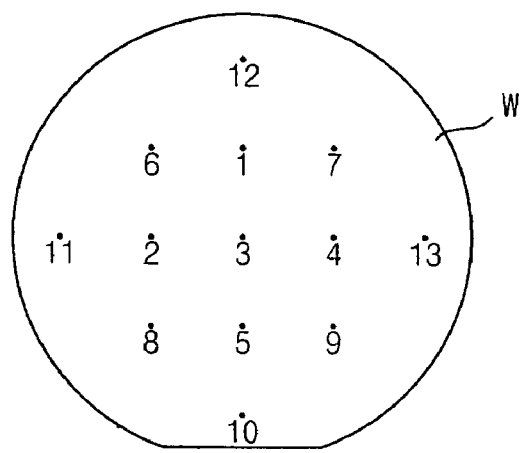
FIG. 3 is a plan view illustrating a wafer marked with points for measuring thickness of oxide layers.

Table 1 illustrates the thickness (in Å) of oxide layers formed on wafers in accordance with an exemplary conventional radical oxidation method. FIG. 3 is a plan view illustrating a wafer marked with points for measuring the thickness of the oxide layer. In Table 1, the wafer numbers correspond to the slot numbers of the wafer boat, respectively.

TABLE 1

| Point number | Wafer number | | | | |
|---|---|---|---|---|---|
| | 11 | 37 | 63 | 89 | 115 |
| 1 | 27.739 | 27.766 | 27.856 | 28.192 | 27.720 |
| 2 | 28.135 | 28.135 | 28.138 | 28.367 | 27.738 |
| 3 | 27.683 | 27.586 | 27.831 | 28.037 | 27.952 |
| 4 | 27.593 | 27.595 | 27.667 | 28.023 | 27.810 |
| 5 | 28.046 | 27.746 | 27.801 | 28.132 | 27.809 |
| 6 | 28.165 | 27.921 | 27.867 | 28.068 | 27.408 |
| 7 | 28.513 | 28.405 | 28.456 | 28.605 | 27.891 |
| 8 | 27.784 | 27.714 | 27.831 | 28.149 | 27.625 |
| 9 | 28.229 | 27.917 | 27.870 | 28.188 | 27.832 |
| 10 | 28.972 | 28.717 | 28.658 | 28.990 | 28.301 |
| 11 | 29.888 | 29.720 | 29.232 | 29.233 | 28.000 |

TABLE 1-continued

|  | Wafer number | | | | |
| --- | --- | --- | --- | --- | --- |
| Point number | 11 | 37 | 63 | 89 | 115 |
| 12 | 28.192 | 28.222 | 28.568 | 29.017 | 28.206 |
| 13 | 27.875 | 28.177 | 28.354 | 28.585 | 27.993 |
| Average thickness | 28.22 | 28.12 | 28.16 | 28.43 | 27.87 |
| Thickness difference | 2.30 | 2.13 | 1.56 | 1.21 | 0.89 |
| Uniformity | 4.07 | 3.79 | 2.73 | 2.13 | 1.6 |

According to the exemplary conventional radical oxidation method, after wafers are loaded onto a boat, the boat having the wafers thereon moves upwardly to transfer the wafers into a reaction tube without the rotation of the boat. The boat is rotated at a predetermined rotational speed, and a reaction gas is provided into the reaction tube. Thus, oxide layers are formed on the wafers. After the boat moves downwardly to take the wafers out of the reaction tube without the rotation of the boat, the wafers are unloaded from the boat.

In the exemplary conventional radical oxidation method for forming the oxide layer, the reaction gas including an oxygen ($O_2$) gas and a nitrogen ($N_2$) gas is provided onto the wafers for about 4 minutes. When the reaction gas is provided onto the wafers, the reaction tube has a temperature of about 850° C., and a pressure of about 35 Pa. Additionally, the boat is rotated at a rotational speed of about 1 rpm while the reaction gas is provided onto the wafer Table 2 shows the thickness (in Å) of oxide layers formed on wafers according to methods according to embodiments of the present invention as described above with reference to FIGS. 1 and 2. In Table 2, the wafer numbers correspond to the slot numbers of the wafer boat of FIG. 3. The points for measuring the thicknesses of the oxide layers are substantially the same as those of FIG. 3.

TABLE 2

|  | Wafer number | | | | |
| --- | --- | --- | --- | --- | --- |
| Point number | 11 | 37 | 63 | 89 | 115 |
| 1 | 27.479 | 27.552 | 27.632 | 27.991 | 27.510 |
| 2 | 27.520 | 27.561 | 27.719 | 28.013 | 27.601 |
| 3 | 27.607 | 28.013 | 28.347 | 28.770 | 28.290 |
| 4 | 27.490 | 27.537 | 27.658 | 27.993 | 27.518 |
| 5 | 27.395 | 27.408 | 27.565 | 27.778 | 27.387 |
| 6 | 27.561 | 27.484 | 27.600 | 27.903 | 27.318 |
| 7 | 27.653 | 27.869 | 27.871 | 28.138 | 27.485 |
| 8 | 27.711 | 27.658 | 27.788 | 28.131 | 21.549 |
| 9 | 27.493 | 27.547 | 27.632 | 27.978 | 27.461 |
| 10 | 28.183 | 28.275 | 28.392 | 28.526 | 27.594 |
| 11 | 27.823 | 28.011 | 28.010 | 28.260 | 27.591 |
| 12 | 27.711 | 27.831 | 27.875 | 28.124 | 27.555 |
| 13 | 27.674 | 27.645 | 27.797 | 28.159 | 27.401 |
| Average thickness | 27.64 | 27.72 | 27.84 | 28.14 | 27.56 |
| Thickness difference | 0.79 | 0.87 | 0.83 | 0.99 | 0.97 |
| Uniformity | 1.42 | 1.56 | 1.49 | 1.76 | 1.76 |

In the method for forming the layer accordance to the present invention, the reaction gas including the oxygen gas and the nitrogen gas is provided onto the wafers for about 4 minutes. While the reaction gas is provided onto the wafers, the reaction tube has a temperature of about 850° C., and a pressure of about 35 Pa. In addition, the boat is rotated at a rotational speed of about 1 rpm while the reaction gas is provided onto the wafers.

As shown in Tables 1 and 2, each of the thickness differences is obtained by subtracting the maximum thickness of the oxide layer (e.g., generally at a point near the edge portions of the wafer) from the minimum thickness of the oxide layer (e.g., generally at a point near the outer portions of the wafer). The average thickness of the oxide layers formed by the conventional radical oxidation methods is substantially the same as those of the oxide layers formed by the method of the present invention. The thickness differences of the oxide layers formed by the conventional radical oxidation method are about 2 Å, whereas the thickness differences of the oxide layers by the method of the present invention are below about 1 Å.

When the oxide layers are formed according to the exemplary conventional radical oxidation process, the edge portions of the oxide layers (the point numbers are 10, 11, 12, and 13) have thickness thicker than that of other portions of the oxide layers. However, when the oxide layers are formed according to the method of the present invention, the entire portions of the oxide layers have substantially the same thickness.

In Tables 1 and 2, the uniformities of the oxide layers are obtained in accordance with the following relationship:

Uniformity=(thickness difference/average thickness)×(100/2)

As shown in Tables 1 and 2, the uniformities of the oxide layers formed according to the present invention are more improved than those of the oxide layers formed by the exemplary conventional radical oxidation method.

Figure 4:
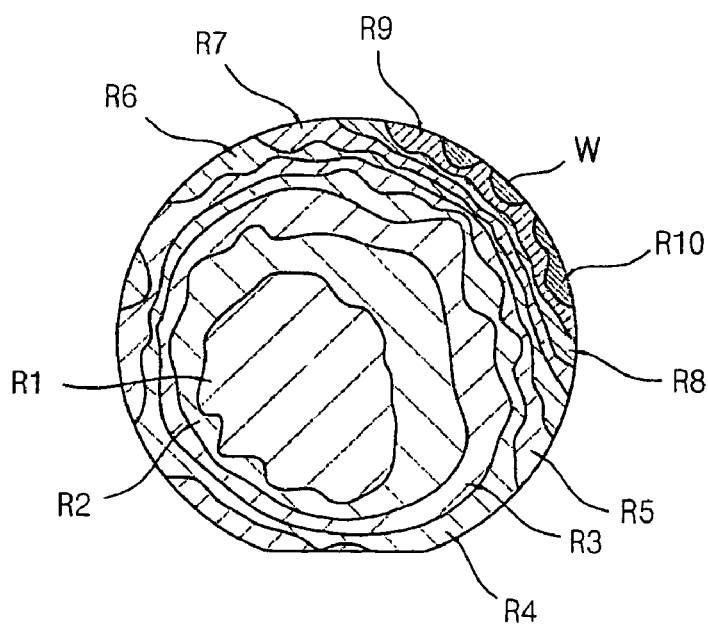
FIG. 4 is a plan view illustrating a thickness distribution of an oxide layer formed on a wafer such that a wafer boat including the wafer moves upwardly and downwardly without rotating the wafer boat.

FIG. 4 is a plan view illustrating the thickness distribution of an oxide layer formed on a wafer when a wafer boat including the wafer moves upwardly and downwardly without rotating the wafer boat according to exemplary conventional techniques. In FIG. 4, R1 to R10 indicate the thickness of the entire portions of the oxide layer.

Referring to FIG. 4, the thickness of the edge portion of the oxide layer are thicker than that of the central portion of the oxide layer. That is, the oxide layers are irregularly formed on the wafer while the wafer boat moves upwardly and downwardly.

According to embodiments of the present invention, when oxide layers are formed on wafers, a wafer boat including the wafers thereon is rotated at a predetermined rotational speed while the wafer boat is transferred between the reaction tube and the transfer chamber. Therefore, the oxide layers may be formed on the wafers to have uniform thickness.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

What is claimed is:

1. A method of forming a layer on a semiconductor wafer in an apparatus having a processing chamber, a transferring chamber, and a wafer boat, the method comprising:

rotating the boat having a plurality of semiconductor wafers thereon in the transferring chamber with a rotational speed of about 0.5 to about 5 rpm, the plurality of the semiconductor wafers concentrically arranged along a perpendicular direction, and a central rotational axis of the boat passes through a central portion of the semiconductor wafers; and while rotating the boat, transferring the boat between the transferring chamber and the processing chamber and providing a reaction gas to the processing chamber to form the layer on the wafer; and while rotating the boat, moving the boat downwardly to transfer the boat from the processing chamber to the transferring chamber.

2. The method of claim 1, wherein a thickness difference between an edge portion of the layer and a central portion of the layer is less than about 1 Å.

3. The method of claim 1, including rotating the boat while transferring the boat from the transferring chamber to the processing chamber before exposing the wafer to the reaction gas.

4. The method of claim 1, including rotating the boat while transferring the boat from the processing chamber into the transferring chamber after providing the reaction gas to form the layer.

5. The method of claim 1, including transferring the boat between the transferring chamber and the processing chamber in a vertical direction.

6. The method of claim 1, including heating the wafer in a heat treatment reaction tube of the processing chamber while providing the reaction gas to the reaction tube of the processing chamber.

7. The method of claim 1, wherein the rotational speed is in a range of about 1 to about 2 rpm.

8. The method of claim 1, wherein the reaction gas comprises an oxygen (O2) gas and a nitrogen (N2) gas.

9. The method of claim 1, further comprising providing a nitrogen gas to the transferring chamber while transferring the wafer between the transferring chamber and the processing chamber.

10. The method of claim 1, wherein the layer comprises an oxide.

11. The method of claim 1, wherein the layer comprises silicon oxide.

12. The method of claim 1, further comprising:
loading the wafer onto the boat while the boat is in the transferring chamber under the reaction tube;
moving the boat upwardly to transfer the wafer from the transferring chamber into the processing chamber; and
moving the boat downwardly to transfer the wafer from the processing chamber to the transferring chamber.

13. A method of forming oxide layers comprising:
loading a plurality of wafers onto a boat positioned in a transferring chamber;
moving the boat upwardly to transfer the boat into a vertical reaction tube disposed over the transferring chamber while the boat is being rotated at a rotational speed of about 1 to about 2 rpm;
providing oxygen radicals onto surfaces of the wafers loaded on the boat disposed in the reaction tube to form an oxide layer on the wafers;
moving the boat downwardly to transfer the boat from the reaction tube into the transferring chamber while the boat is being rotated at a rotational speed of about 1 to about 2 rpm; and
unloading the wafers from the boat;
wherein the semiconductor wafers are concentrically arranged along a perpendicular direction, and a central rotational axis of the boat passes through a central portion of the semiconductor wafers.

14. The method of claim 13, further comprising providing a reaction gas including an oxygen (O2) gas and a hydrogen (H2) gas, wherein the oxygen radicals are formed in accordance with a reaction between the oxygen gas and the hydrogen gas.

15. The method of claim 13, wherein a thickness difference between an edge portion of the oxide layer and a central portion of the oxide layer is less than about 1 Å.

16. The method of claim 13, wherein the reaction tube has a temperature of about 600 to about 1,200° C. when the oxide layers are formed on the wafers.

17. The method of claim 13, wherein the reaction chamber has a pressure of about 25 to about 100 Pa when the oxide layers are formed on the wafers.

18. The method of claim 13, further comprising providing a nitrogen gas into the transferring chamber.

19. A method of forming a layer on a semiconductor wafer, the method comprising:
while rotating a plurality of semiconductor wafers with a rotational speed of about 1 to about 2 rpm, transferring the wafer to a processing chamber and providing a reaction gas to the processing chamber to form the layer on the wafer; and
while rotating the wafer, moving the wafer downwardly to transfer the wafer from the processing chamber to a transferring chamber,
wherein the semiconductor wafers are concentrically arranged along a perpendicular direction, and a central rotational axis of the boat passes through a central portion of the semiconductor wafers.

* * * * *